(12) United States Patent
Pan

(10) Patent No.: US 6,242,780 B1
(45) Date of Patent: Jun. 5, 2001

(54) ELECTROSTATIC DISCHARGE PROTECTION CIRCUIT

(75) Inventor: Jui-Hsiang Pan, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/425,605

(22) Filed: Oct. 22, 1999

(51) Int. Cl.$^7$ ................................ H01L 29/74; H01L 23/62
(52) U.S. Cl. ........................ 257/355; 257/356; 257/173
(58) Field of Search .............................. 361/56; 257/355, 257/356, 546, 547, 173

(56) References Cited

U.S. PATENT DOCUMENTS 5,637,900 * 6/1997 Ker et al. ........................... 257/355

* cited by examiner

Primary Examiner—William Mintel
Assistant Examiner—Ori Nadav

(57) ABSTRACT

The electrostatic discharge protection circuit provided by the present invention is an ESD protection circuit with field oxide device, moreover the provided ESD protection circuit uses both PN diode and parasitic bipolar to conduct charger from the input pad of integrated circuit. The equivalent circuit of the invention is equal to the equivalent circuit of conventional FOD kind ESD protection circuit, and the basic structure also is similar to the structure of a conventional ESD protection circuit. The main characteristic of the invention is that deep junction is used to increase junction cross-section area of each junction, especially a deep drain-like junction. In other words, deep junctions are used in the following cases: Drain-like region of field oxide device, diode between VDD and VSS, and diode between the VDD and the pad. Therefore, not only resistivity of each junction decreased but also the maximum electrical field of each diode is far away from the surface of the substrate, and then local heating is efficiently decreased and the lifetime of the proposed ESD circuit is prolonged.

18 Claims, 5 Drawing Sheets

ELECTROSTATIC DISCHARGE PROTECTION CIRCUIT

BACKGROUND OF THE INVENTION

1. Field of the Invention

The invention is in the field of electrostatic discharge (ESD) protection circuit, and is more specifically directed to an ESD circuit with a field oxide device (FOD).

2. Description of the Prior Art

Electrostatic protection is an important field of integrated circuits. The ESD protection circuit is used to protect chips from damage caused by a large current and a large voltage, especially from external charges.

There are many varieties of ESD protection circuit, and one useful variety of ESD circuits is the FOD kind ESD protection circuit that uses a field oxide device and a PN diode. As usual, parasitic bipolar is also used to conduct current from the pad into the substrate.

The equivalent circuit diagram of the FOD kind ESD protection circuit is shown in FIG. 1. As FIG. 1 shows, a current (charger) is conducted through input terminal 10, internal input buffer 11 and internal chips 12. Moreover, FOD 13 and first diode 14 are located between input terminal 10 and internal input buffer 11, and is in sequence with internal input buffer 11. Besides, first diode 14 connects to VDD 15 and FOD 13 is connected to VSS 16, and second diode 17 is located between VDD 15 and VSS 16. Herein, the normal state of both FOD 13 and first diode 14 are off, and when the external current appears they are turned on to conduct the current such that the external current will not be conducted into chips 12.

The structure of the conventional FOD kind of ESD protection circuit is shown in FIG. 2, where a qualitative cross section view is provided. As FIG. 2 shows, there are several isolations 21 located in and on the surface part of substrate 20, where isolations 21 are used to isolate each structure that locates in and on the surface part of the substrate 20. Moreover, FOD 13 comprises first region 22, field oxide 23, second region 24 and third region 25; first diode 14 comprises fourth region 26 and fifth region 27; and second diode 17 comprises sixth region 28 and seventh region 29. Besides, input terminal 10 connects to first region 22 and fifth region 26; VDD 15 connects to both fifth region 27 and seventh region 29; VSS 16 connects to second region 24, third region 25 and sixth region 28. Additionally, second diode is located on first well 293 and FOD 13 is located on second well 296. Herein conductive type of first well 293 is equal to second well 296 but is opposite to conductive type of substrate 20. Further, conductive type of third region 25, fourth region 26 and sixth region 28 are equal to conductive type of first well 293, but conductive type of first region 22, second region 24, fifth region 27 and seventh region 29 are equal to substrate 20.

Comparing FIG. 1 and FIG. 2, it is clear that when external charge is applied, avalanche breakdown appears in drain of FOD 13 (first region 22) and then a parasitic bipolar is formed inside the substrate 10. Herein parasitic bipolar is used to let charge be conducted into substrate 10 (substrate 10 acts as a ground). Owing to the fact that the turn on rate of the parasitic bipolar is not fast enough, first diode 14 and second diode 15 will be forward biased to share an external charger until the parasitic bipolar is turned on.

Because the depth of each region is finite, the junction cross-section area also is finite and then current density cannot be arbitrarily decreased. Therefore, owing to the fact that power is proportional to current and current density is higher in the surface part the of substrate 10, it is especially higher in neighboring corners of two regions of the same diode. Local heating is an unavoidable result and will induce contact melting such that material of contact (such as metal) is melted, and then melted material flows into a neighboring well and induces short of ESD protection circuit. Obviously, the local heating is more serious when shallow junction is required and the current path is concentrated in the surface of substrate 10.

According to the previous discussion, an unsolved issue of the conventional ESD protection circuit is the local heating phenomena. Because ESD protection circuit will be degraded or even be invalidated, it is desired to overcome the unsolved issue such that the circuit's lifetime is prolonged and performance is improved.

SUMMARY OF THE INVENTION

It is an object of the invention to provide a structure of FOD kind ESD protection circuit.

It is another object of the invention to provide such an ESD protection circuit that efficiently reduces the effect of local heating phenomena.

It is a further object of the invention to provide an ESD protection circuit that is applicable with shallow junction.

It is still a further object of the invention to provide a manufacturable structure of ESD protection circuit.

In order to explain the invention, an embodiment is used to present a specific structure of ESD protection circuit that efficiently prevents the issue of local heating.

The content of the embodiment is described as follows: First, the equivalent circuit of the invention is equal to the conventional FOD kind of ESD protection circuit, and the basic structure also is similar to a conventional ESD protection circuit. Second, in order to overcome the local heating phenomena, deep junction is applied to form a drain-like region of each diode and a drain-like region of FOD. Thus, junction cross-section area is increased and current density is decreased. Besides, owing to the fact that energy of the carrier is higher in the depletion area of the drain-like region, the heating effect is efficiently reduced. Moreover, the deep junction also permits distribution of an electric field is far away from the surface of the substrate. Third, low doped density junction is used to form drain-like regions of all diodes and a drain-like region of FOD. Owing to the fact that current density of the junction is proportional to doped density of the junction, current density is further decreased. Of course, owing to the restriction of integration of the fabrication process, drain-like regions of all diodes and the drain-like region of FOD can be formed as a low doped density junction with a high doped junction that is located on the low doped density junction.

In conclusion, the main characteristic of the invention is that deep junction is used to increase junction cross-section area of all diodes and the FOD. Therefore, not only is the resistivity of each diode decreased but also distribution of the electrical field of each diode is also far away from the surface of the substrate. Thus, diode local heating is efficiently decreased and the lifetime of the proposed ESD circuit is prolonged.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4A illustrates the conventional case and FIG. 4B illustrates the present embodiment.

DESCRIPTION OF THE PREFERRED EMBODIMENT

Figure 3:
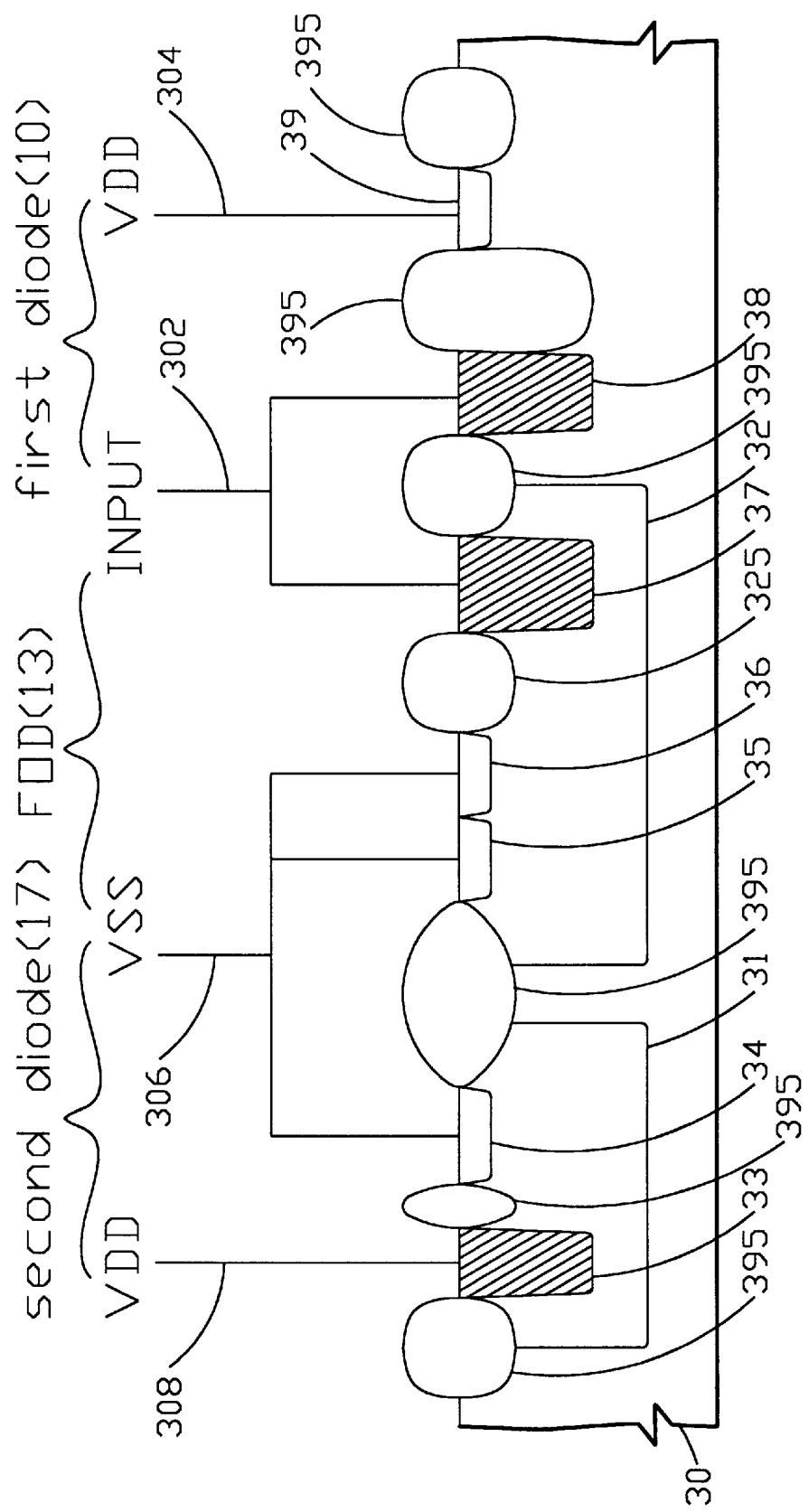
FIG. 3 is a cross-sectional view of the structure of a FOD kind ESD protection circuit that is presented by one embodiment of the proposed invention.

The qualitative structure of the presented invention is introduced by a cross-sectional view as shown in FIG. 3, and is explained in following paragraphs.

Before discussing FIG. 3, it should be noted that the equivalent circuit of the invention is similar to the conventional FOD kind of ESD protection circuit as mentioned in the above paragraphs. Thus, the structure of the embodiment also comprises FOD and two diodes. Moreover, diodes also are used to share current before parasitic bipolar is established and then any current is conducted into the substrate.

As FIG. 3 shows, the illustrated FOD kind of ESD protection circuit is formed in and on substrate 30. Substrate 30 can be an N-type substrate or a P-type substrate and material of substrate 30 can be silicon or polysilicon. Moreover, several isolations 395 are located in and on substrate 30 and are used to separate and isolate some structures that are located in and on substrate 30.

Figure 1:
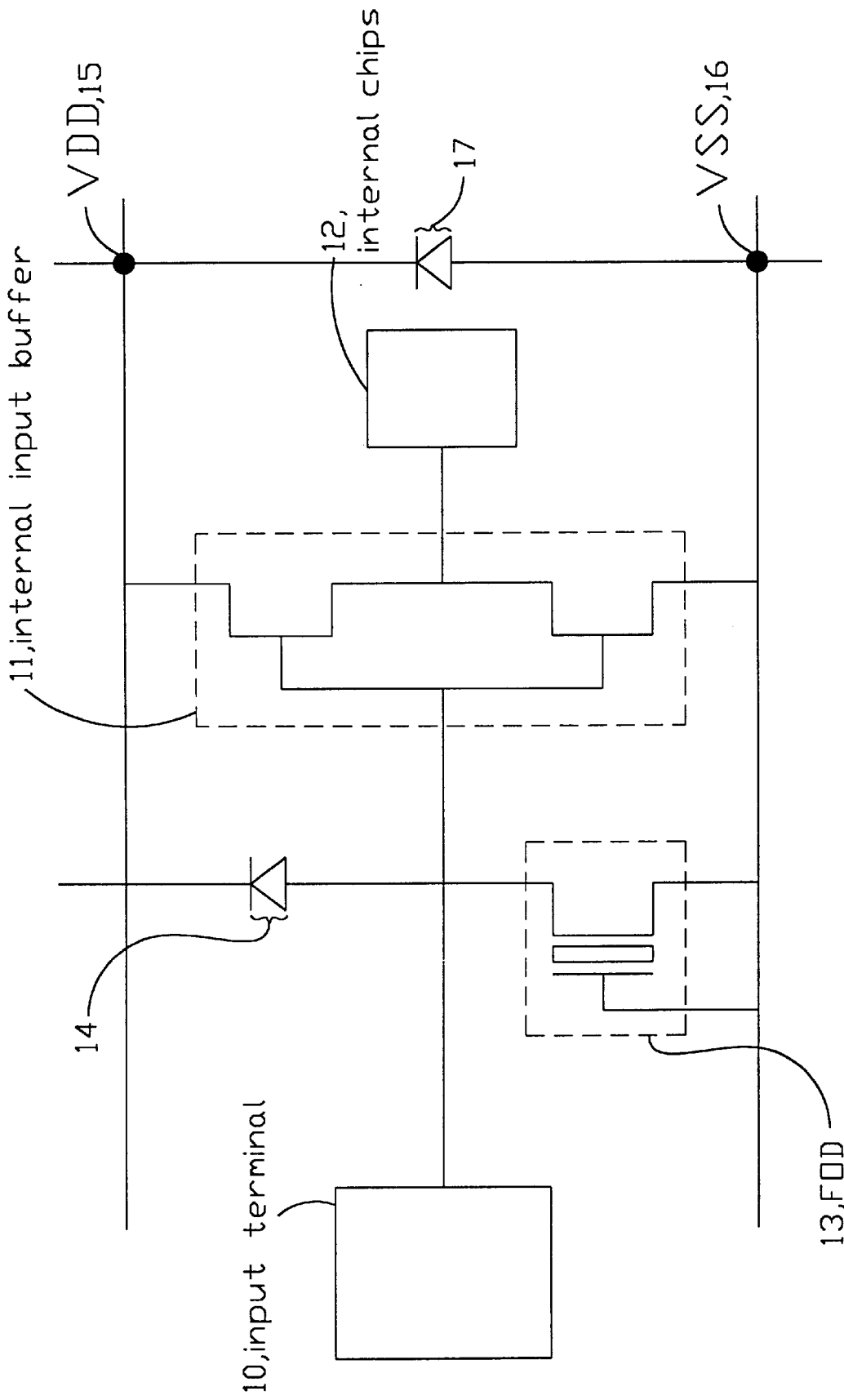
FIG. 1 is the equivalent circuit diagram of FOD kind of ESD protection circuit.
Figure 2:
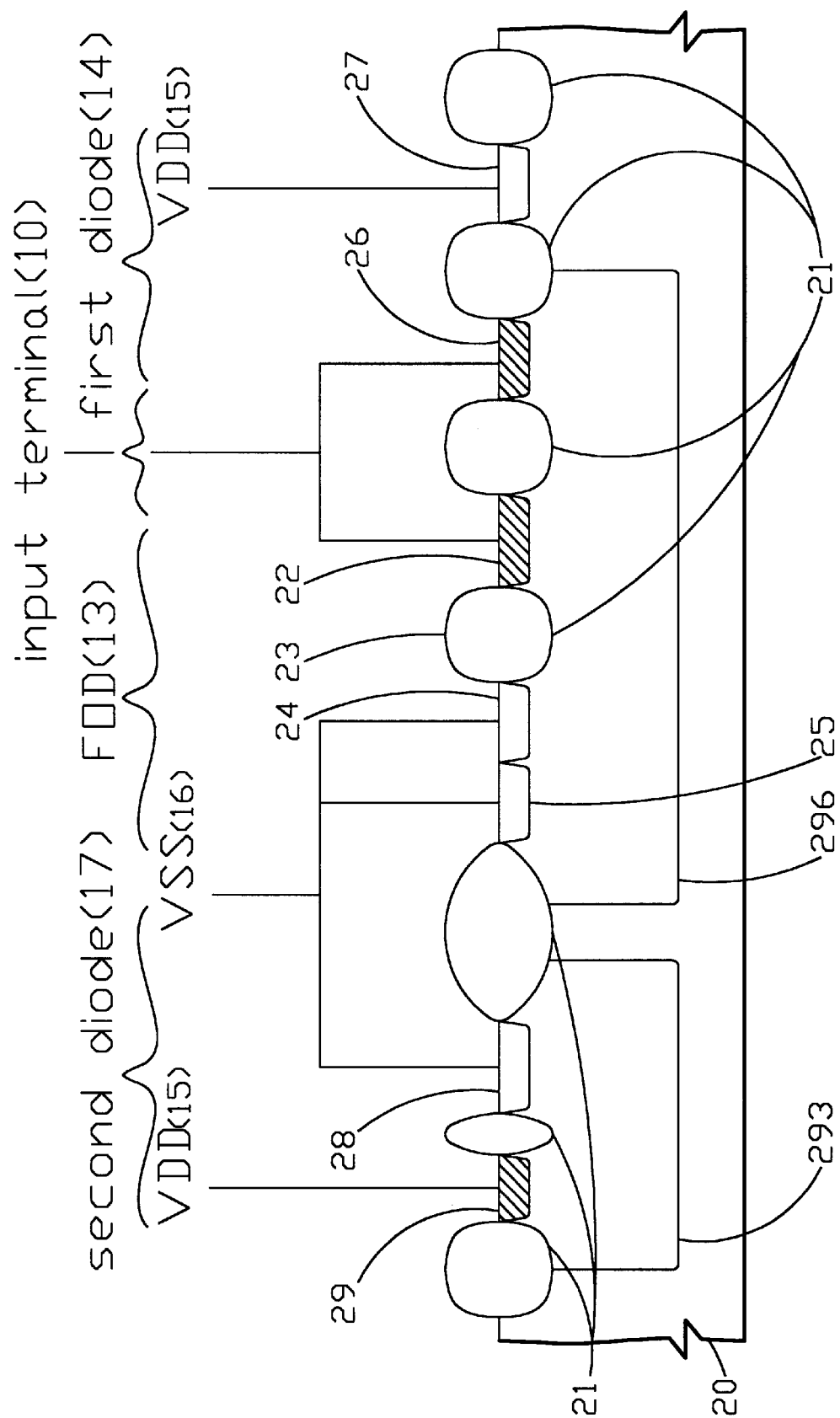
FIG. 2 is a cross-sectional view of the structure of a conventional FOD kind of ESD protection circuit.

Obviously, comparing FIG. 3 and FIG. 2, second diode is formed in and on first well 31. An FOD is formed in and on second well 32, and first diode is directly formed in and on substrate 30. Moreover, both first well 31 and second well 32 are located in surface of substrate 30 and are abutted to the surface. Herein, conductive type of second well 32 is the same as conductive type of first well 31, but conductive type of first well 31 is opposite to conductive type of substrate 30. Beside, first well 31 and second well 32 is separated by isolation 395.

Both first doped region 33 and second doped region 34 are located in the surface first well 31 and abut the surface. First doped region 33 is of a first conductive type and second doped region 34 is of a second conductive type. Further, first doped region 33 is in contact with second doped region 34, but is separated by isolation 395. Moreover, first doped region 33 is deeper than second doped region 34.

Inside second well 32, third doped region 35, fourth doped region 36 and fifth doped region 37 are formed in the surface second well 32 and abut the surface. Third doped region 35 and fourth doped region 36 are of a second conductive type, and fifth doped region 37 is of the first conductive type. Moreover, fifth doped region 37 is deeper than fourth doped region 36. Fourth doped region 36 is closed to third doped region 35, but is separated from fifth doped region 37 by field oxide 325. As usual depth of field oxide 325 is larger than the depth of fourth doped region 36. Further, third doped region is neighboring to first well 31 but fifth doped region 37 is far away from first well 32.

Sixth doped region 38 and seventh doped region 39 not only are located in the surface of substrate 30 and abut the surface, but also are neighboring to second well 32 and are far away from first well 31. Moreover, sixth doped region 38 is of the second conductive type and seventh doped region 39 is of the first conductive type. Beside, sixth doped region 38 is deeper than seventh doped region 39.

In the description of the preferred embodiment, any doped region can be formed by so-called shallow junction. Moreover, first doped region 33, fifth doped region 37 and sixth doped region 38 are so-called drain-like regions that usually behave as a drain. In comparison, second doped region 34, third doped region 35, fourth doped region 36 and seventh doped region 39 are so-called source-like regions that usually behaves as source.

Additionally, depth of so-called source-like region is less than the depth of the so-called drain-like region. Regardless, any source-like region does need to be a shallow junction, though when critical dimension is decreased and all so-called source-like regions usually are shallow junctions with a typical depth that less than 1000 angstroms.

Furthermore, the first conductive line 302 connects both fifth doped region 37 and seventh doped region 38 to a input terminal of an integrated circuit, possible input terminal input terminal comprises pad; second conductive line 304 connects seventh doped region 39 to a VDD source; third conductive line 306 connects a VSS source to second doped region 34, third doped region 35 and fourth doped region 36; and fourth conductive line 308 connects first doped region 33 to the VDD source.

Anyway, the first conductive type can be electropositivity or electronegativity, and the second conductive type comprises electronegativity or electropositivity. However, the first conductive type always is opposite to the second conductive type, and the first conductive type is the same as the conductive type of substrate 30.

Figure 4A:
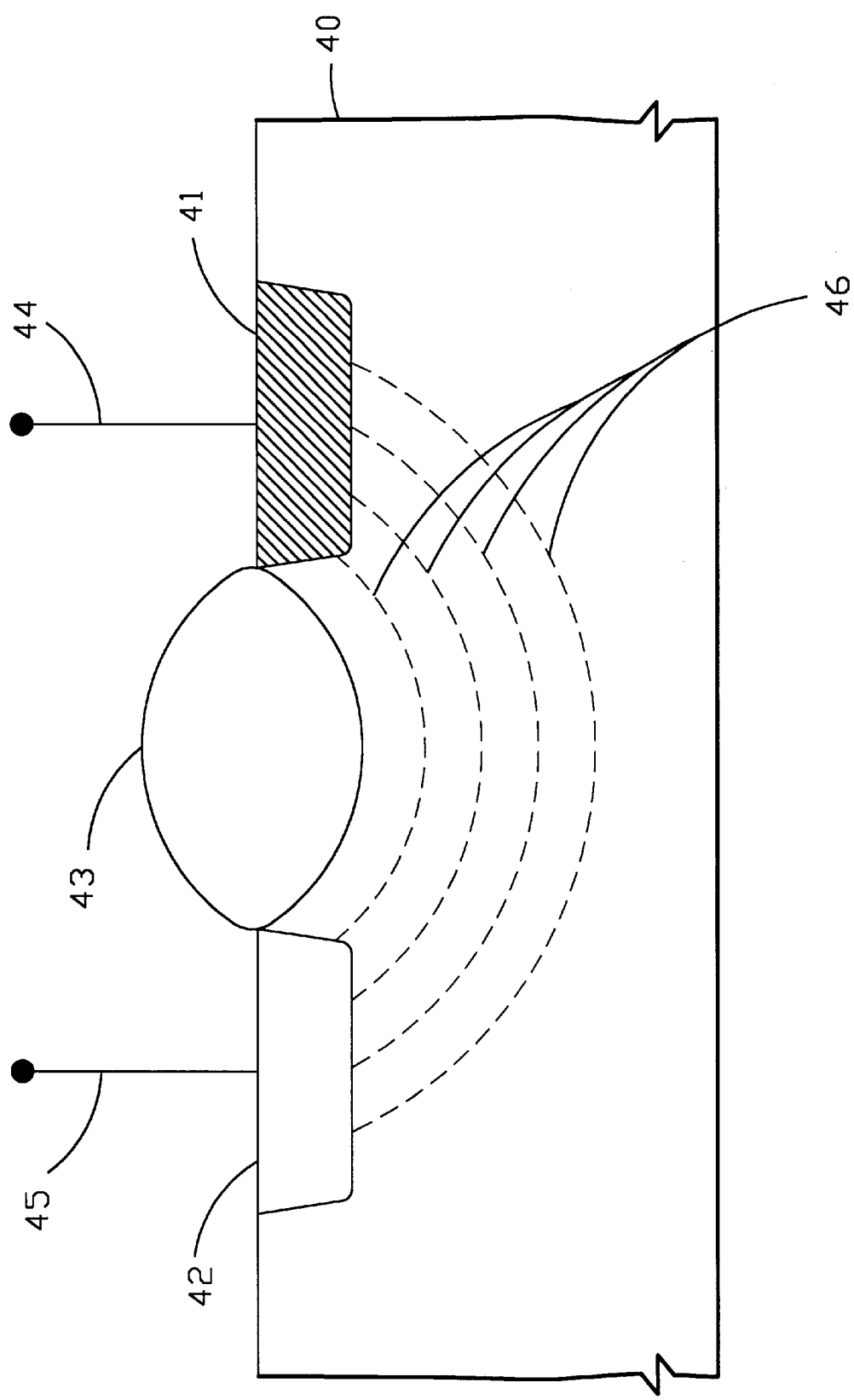
FIG. 4A and FIG. 4B illustrate the mechanism of the present embodiment, where
Figure 4B:
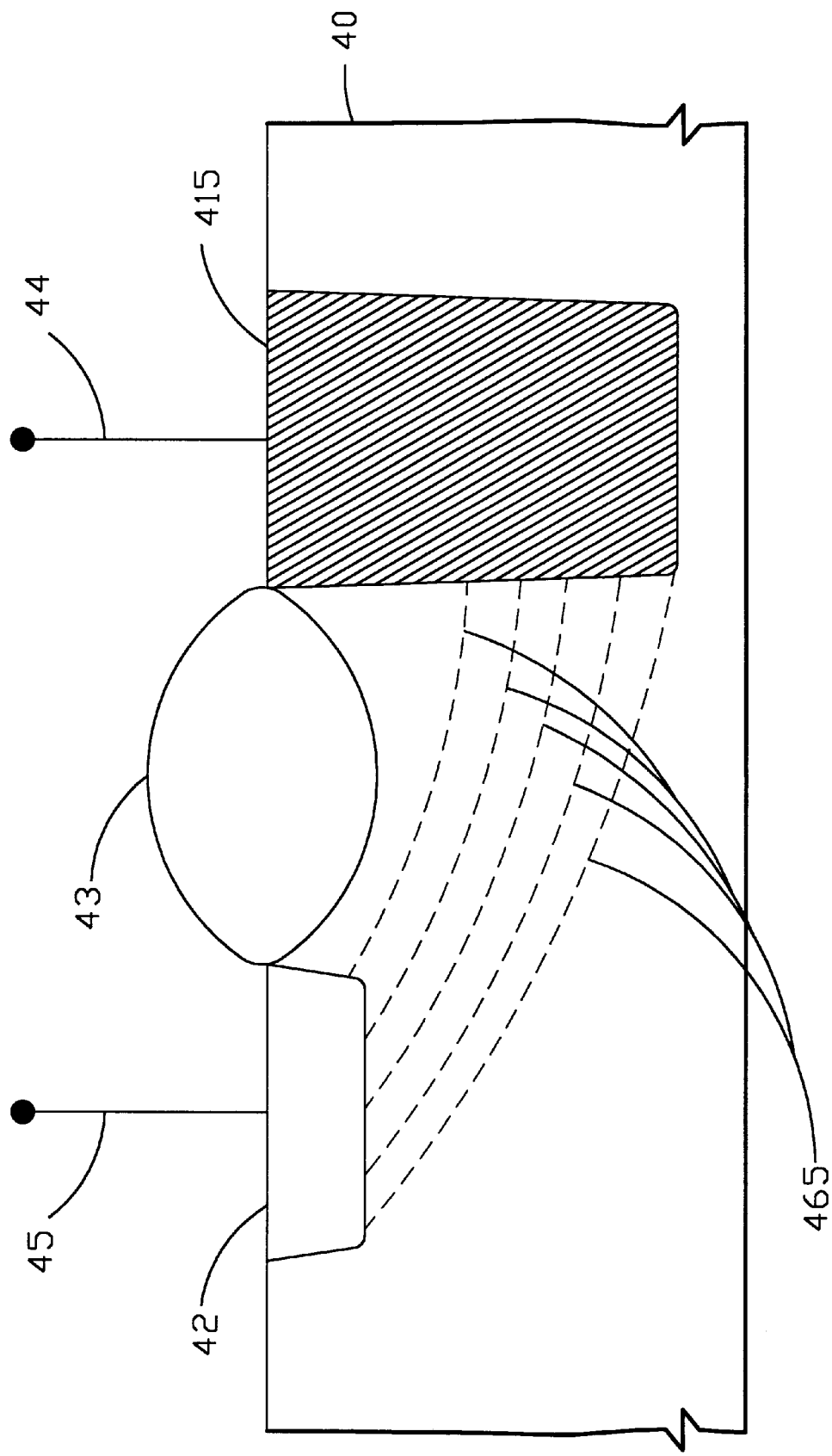

The mechanism can be further explained by FIG. 4A, FIG. 4B and the following discussion. FIG. 4A illustrates the conventional condition that all doped regions have almost the same depth, and FIG. 4B illustrates the presented embodiment that one doped region is deeper than another doped region.

Referring to FIG. 4A, when a charge is applied at first conductive line 44 or second conductive line 45, current is flows between first doped region 41 and second doped region 42. Because first doped region 41 and second doped region 42 is separated by isolation 43, current will flow through interior of substrate 40. Regardless, electrical field is concentrated in the surface of substrate 40 as dot lines 46 indicate, then heat also is concentrated in the surface of substrate 40 and induces so-called local heating phenomena, especially in the doped region that behaves as the drain for the charge that is accelerated during the conductive path between the two doped regions.

In comparison, referring to FIG. 4B. The only difference between FIG. 4B and FIG. 4A is that the depth of first doped region 415 is larger than the depth of second doped region 42, where first doped region 415 behaves as the drain. Then when a charge is applied and conducted inside substrate 40, not only is the junction cross section increased such that resistivity is decreased, but also the distribution of the electric field is not concentrated in the surface of substrate 40 as dotted lines 465 indicate. Therefore, accumulated heat also is not concentrated in the surface of the substrate 40 as dotted lines 46 indicate, and then the effect of local heating phenomena is weakened.

It should be noted that when a shallow junction is required, the local heating phenomena is stronger and more serious as depths of all doped regions are obviously decreased. Hence, the advantage of the proposed invention is significant for the depth of first doped region 415 is greater than the depth of the second doped region 42 that usually is provided by a shallow junction. Thus, even though the depth of second doped region 42 is small, the depth of the drain (first doped region 415) is large and then junction cross-section is efficiently increased. Accordingly, the proposed invention is more beneficial and useful for such ESD protection circuit that shallow junction is required.

Furthermore, owing to the fact that current density also is proportional to density of doped impurity, it is possible and reasonable that first doped region 415 is a retrograde doped region that combined by a deep doped subregion and a shallow doped subregion. Herein, shallow doped subregion is located on deep doped subregion and doped density of deep doped subregion is different to doped density of shallow doped subregion. Of course, owing to restriction of manufacturable fabrication, doped density of deep doped subregion usually is less than doped density of shallow doped subregion.

Owing to the same reason, first doped region 33 also can be a retrograde doped region that can comprise a first deep subregion and a first shallow subregion, where first shallow subregion is located on first deep subregion and doped density of first deep subregion is different from the doped density of the first shallow subregion; fifth doped region 37 also can comprise a second deep subregion and a second shallow subregion, where second shallow subregion is located on the second deep subregion and the doped density of the second deep subregion is different from the doped density of the second shallow subregion; sixth doped region 39 also is a retrograde doped region that comprises a third deep subregion and a third shallow subregion, wherein the third shallow subregion is located on the third deep subregion and the doped density of the third deep subregion is different from the doped density of the third shallow subregion.

Consequentially, because in most fabrication processes, these shallow subregions are formed with some source-like regions having the same doped impurity and the same doped density at the same time. The depth of each shallow subregion usually is equal to the depth of each source-like region.

Consequently, and referring to FIG. 3 and FIG. 4B, it is obvious that whether there is a passive test between first conductive line 302 and VSS, a negative test between conductive line 302 and VDD and a passive test between VDD and VSS, relative drain-like regions always can efficiently increase junction cross-section area and weaken effect of local heating. In other words, the proposed FOD kind of ESD protection circuit can properly prevent damage of local heating, and then the function and lifetime of the proposed ESD protection circuit is excellent compared with that of conventional FOD kind of ESD protection circuit.

It should be noted that the depth of any drain-like region can be different from the depth of other drain-like regions. Moreover, though the presented embodiment shows that drain-like regions are used by both FOD and all diodes, the invention is not limited by the specific case. In fact, whether drain-like regions of both FOD and all diodes are deeper than source-like regions of all diodes and FOD is not characteristic of the invention. One main characteristic is that asymmetry depth of both drain-like region and source-like region is used whenever local heating is an issue. Therefore, it is clear that though the embodiment only discusses the case that drain-like region is deeper than source-like region, the opposite case also is another embodiment of the invention. Beside, it is also important that though the embodiment only discusses the FOD kind of ESD protection circuit, the invention also can be used for any kind of ESD protection circuit that local heating is an issue and deep junction is a possible way to solve the issue.

While the invention has been described by the preferred embodiment, the invention is not limited thereto. To the contrary, it is intended to cover various modifications and the scope of these claims therefore should be accorded to the broadest interpretation so as to encompass all such modifications and similar arrangement, procedures and products.

What is claimed is:

1. An electrostatic discharge protection circuit, said protection circuit comprising:

a first well, wherein said first well is located in a substrate and is abutted a surface of said substrate;

a second well, wherein said second well is located in said substrate and is abutted said surface of said substrate, conductive type of said second well being the same as conductive type of said first well;

a first doped region, wherein said first doped region is located in said first well and is abutted said surface of said substrate, said first doped region having a first conductive type;

a second doped region, wherein said second doped region is located in said first well and is abutted said surface if said substrate, said second doped region having a second conductive type opposite said first conductive type, wherein depth of said second doped region is smaller than depth of said first doped region;

a third doped region, wherein said third doped region is located in said second well and is abutted said surface of said substrate, said third doped region having said second conductive type and being in contact with said second doped region;

a fourth doped region, wherein said fourth doped region is located in said second well and is abutted said surface of said substrate, said fourth doped region is closed to said third doped region and having said first conductive type;

a fifth doped region, wherein said fifth doped region is located in said second well and is abutted said surface of said substrate, said fifth doped region being not in contact with said first well and having said first conductive type, wherein depth of said fifth doped region is larger than depth of said fourth doped region;

a field oxide, wherein said field oxide is located in said second well and is abutted said surface of said substrate, said field oxide separates said fourth doped region from said fifth doped region;

a sixth doped region, wherein said sixth doped region is located in said substrate and is abutted said surface of said substrate, said sixth doped region is not in contact with said second well and is not in contact with said first well, said sixth doped region having said second conductive type;

a seventh doped region, wherein said seventh doped region is located in said substrate and is abutted said surface of said substrate, said seventh doped region is not in contact with said sixth doped region and is not in contact with said second well, wherein depth of said seventh doped region is less than depth of said sixth doped region, said seventh doped region having said first conductive type;

a first conductive line, wherein said first conductive line connects both said fifth doped region and said sixth doped region to an input terminal of an integrated circuit;

a second conductive line, wherein said second conductive line connects said seventh doped region to a VDD source;

a third conductive line, wherein said third conductive line connects a VSS source to said second doped region, said third doped region and said fourth doped region;

a fourth conductive line, wherein said fourth conductive line connects said first doped region to said VDD source; and a plurality of isolations, wherein said isolations are used to separate said first doped region from said second doped region, separate said first well from said second well, separate said fifth doped region from said sixth doped region, and separate said sixth doped region from said seventh doped region, wherein said isolations also are used to form boundary of said protection circuit.

2. The protection circuit according to claim 1, wherein said substrate comprises P-type substrate.

3. The protection circuit according to claim 1, wherein said substrate comprises N-type substrate.

4. The protection circuit according to claim 1, wherein said first conductive type comprises electropositivity.

5. The protection circuit according to claim 1, wherein said first conductive type comprises electronegativity.

6. The protection circuit according to claim 1, wherein said second conductive type is opposite to said first conductive type.

7. The protection circuit according to claim 1, wherein conductive type of said first well is opposite to said substrate.

8. The protection circuit according to claim 1, wherein said first conductive type is equal to conductive type of said substrate.

9. The protection circuit according to claim 1, wherein said input terminal comprises pad.

10. The protection circuit according to claim 1, wherein said doped regions comprise shallow junction.

11. The protection circuit according to claim 10, wherein depth of said shallow junction is less than about 1000 angstroms.

12. The protection circuit according to claim 1, wherein said first doped region comprises a first deep subregion and a first shallow subregion, said first shallow subregion is located on said first deep subregion.

13. The protection circuit according to claim 12, wherein doped density of said first deep subregion is different to doped density of said first shallow subregion.

14. The protection circuit according to claim 1, wherein said fifth doped region comprises a second deep subregion and a second shallow subregion, said second shallow subregion is located on said second deep subregion.

15. The protection circuit according to claim 14, wherein doped density of said second deep subregion is different to doped density of said second shallow subregion.

16. The protection circuit according to claim 1, wherein said sixth doped region comprises a third deep subregion and a third shallow subregion, said third shallow subregion is located on said third deep subregion.

17. The protection circuit according to claim 16, wherein doped density of said third deep subregion is different to doped density of said third shallow subregion.

18. The protection circuit according to claim 1, wherein depth of each said shallow subregion usually is equal to depth of each said source-like region.

* * * * *